United States Patent [19]
Takase et al.

[11] Patent Number: 5,898,207
[45] Date of Patent: Apr. 27, 1999

[54] METHOD FOR MAKING A SEMICONDUCTOR DEVICE

[75] Inventors: Michihiko Takase, Neyagawa; Koji Eriguchi, Osaka; Bunji Mizuno; Masatoshi Arai, both of Ikoma, all of Japan

[73] Assignee: Matsushita Electric Industrial Co., Ltd., Osaka, Japan

[21] Appl. No.: 08/799,211

[22] Filed: Feb. 13, 1997

[30] Foreign Application Priority Data

Feb. 13, 1996 [JP] Japan ................................. 8-024979
Jun. 11, 1996 [JP] Japan ................................. 8-149004

[51] Int. Cl.$^6$ ............................. H01L 29/76; H01L 29/94
[52] U.S. Cl. ........................ 257/368; 257/213; 257/344; 257/351
[58] Field of Search ................................. 257/344, 351, 257/356, 368, 410, 213, 240

[56] References Cited

U.S. PATENT DOCUMENTS 5,559,352  9/1996  Hsue et al. .......................... 257/328
5,679,968  10/1997  Smayling et al. ................... 257/213

OTHER PUBLICATIONS

M. Takase et al., "Suppressing Ion Implantation Induced Oxide Charging by Utilizing Physically Damaged Oxide Region", The Japan Society of Applied Physics, pp. 410–412 Aug. 26–29, 1996.

Primary Examiner—Valencia Martin-Wallace
Attorney, Agent, or Firm—Ratner & Prestia

[57] ABSTRACT

A semiconductor device with a damage-free insulating layer is fabricated. A method includes the steps of: forming a first insulating layer on a semiconductor substrate, forming a conductive layer on the first insulating layer, patterning the conductive layer to form a gate electrode, forming low-concentration source/drain region by a first ion implantation, removing a portion of the insulating layer positioned under the side end of the gate electrode, forming a second insulating layer over the semiconductor substrate, the second insulating layer is etched to form a sidewall, forming a high-concentration source/drain region by a second ion implantation.

12 Claims, 14 Drawing Sheets

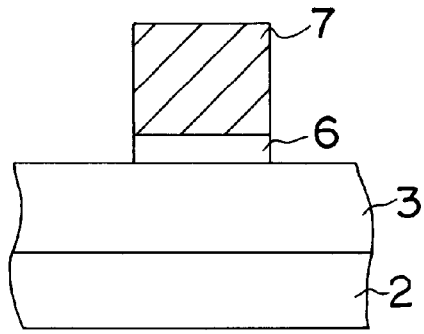
FIG. IA
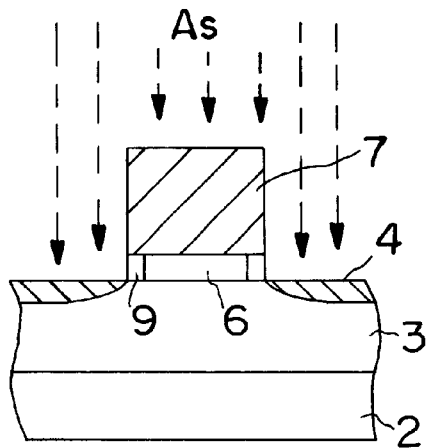
FIG. IB
FIG. IC
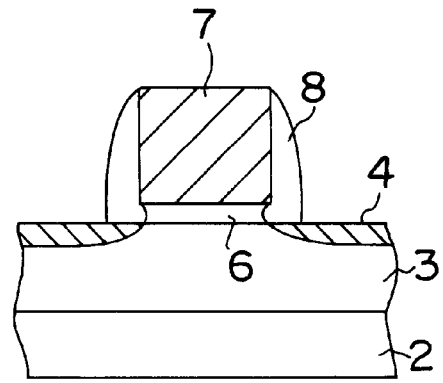
FIG. ID
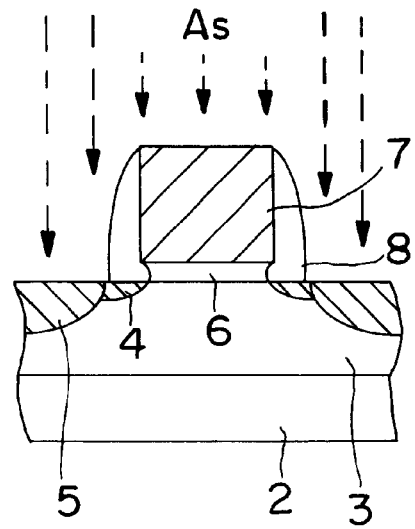
FIG. IE
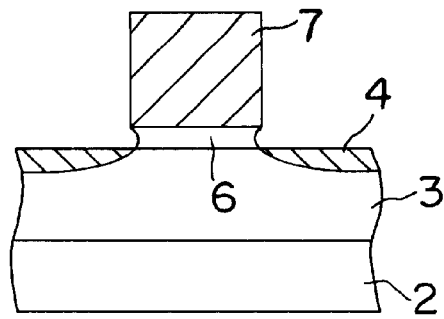

METHOD FOR MAKING A SEMICONDUCTOR DEVICE

BACKGROUND OF THE INVENTION

1. Field of the Invention

The present invention relates to a method for making a semiconductor device including a MOS transistor or a MOS capacitor.

2. Prior Art

In a manufacturing process of semiconductor devices such as a MOS transistor or a MOS capacitor, impurity ions are doped into the surface of a semiconductor substrate after a conductive layer is formed on the semiconductor substrate via an insulating layer. The impurity ions are doped in order to form a source/drain region or an LDD (Lightly Doped Drain-source) region, or to provide conductivity to the conductive layer.

A conventional method of making the aforementioned devices is explained with reference to the figures. FIGS. 20A–20D are cross-sectional views showing conventional process steps for making a MOS transistor. The MOS transistor comprises gate insulating film 74, gate electrode 75, side-wall 76 formed on a p-type silicon substrate 70 having p-well region 71.

First, a polycrystalline silicon film is patterned to form gate electrode 75 on a p-type silicon substrate 70 having p-well region 71, LDD region 72 and source/drain region 73 (FIG. 20A).

Next, Arsenic (As) ions are doped as a first implantation with the acceleration energy of 30 KeV at the dosage of $3\times10^{13}$ atoms/cm$^2$ to form LDD region 72 (FIG. 20B). Then, sidewall 76 is formed by way of etching back a 100 nm-thick High Temperature Oxide (HTO) layer (FIG. 20C). Further, a second ion implantation of As ions is carried out with an acceleration energy of 30 KeV at the dosage of $3\times10^{15}$ atoms/cm$^2$ to form source/drain region 73 (FIG. 20D). In this step, LDD region 72 will not merge with source/drain region 73 since the LDD region 72 is shielded by the sidewall 76 from the second ion implantation.

By the aforementioned process, a semiconductor device (MOS transistor) having an LDD region is completed. The LDD region 72 is formed for the purpose of preventing the generation of hot carriers and for the purpose of preventing the extension of the source/drain region to reach below the gate electrode 75.

In the conventional process, formation of a damaged layer in the gate insulating layer 74 due to the ion implantation degrades the device performance, which becomes more and more serious as the dimension of the device gets smaller and required performance gets higher.

The mechanism therefore is given below.

The gate insulating layer 74 suffers from not only degradation but, in extreme cases, breakdown. It is believed that the degradation is due to the silicon-oxygen bond slashed by incident implant ions or holes/electrons trapped in states formed in the gate insulating layer 74.

This sort of degradation is also observed in a capacitor (MOS capacitor) formed on a semiconductor substrate. A typical capacitor on a semiconductor substrate includes a well region in the semiconductor substrate as the lower capacitor electrode, an insulating film on the lower electrode as the capacitor insulating layer and an upper capacitor electrode on the capacitor insulating film. In a capacitor device of this structure, the upper electrode is typically formed with heavily doped polycrystalline silicon.

The polycrystalline silicon must be doped with a density higher than $10^{14}$ atoms/cm$^2$. The high density doping can form a damaged layer in the capacitor insulating layer as is the case of a MOS transistor gate insulating layer.

It is pointed out that the formation of the damaged layer depends not only on the dosage but the thickness of the insulating layer. Recently, an insulating layer with the thickness as thin as 5 nm or less is in the scope of mass production. A thin insulating layer of this range is naturally vulnerable to ion implantation impact and could be damaged by implantation of relatively small dosages, such as $10^{14}$ atoms/cm$^2$ or less.

Hence, the prime object of the present invention is to increase the reliability of a semiconductor device by providing a damage free insulating layer.

SUMMARY OF THE INVENTION

In order to attain the above object, according to one aspect of the present invention, a method for making a semiconductor device comprises the steps of:

forming an insulating layer on a semiconductor substrate, forming a conductive layer on said insulating layer, patterning said conductive layer, doping impurity ions into at least one of said semiconductor substrate and said conductive layer, and removing at least a part of said insulating layer at a portion where some of said impurity ions were at least one of implanted and passed through.

According to another aspect of the present invention, a method for making a semiconductor device comprises the steps of:

forming an insulating layer on a semiconductor substrate, forming a conductive layer on said insulating layer, patterning said conductive layer, removing a part of said insulating layer underneath said conductive layer to remove at least a part of a portion where some of a plurality of impurity ions are to be implanted or pass through in the following step, and doping impurity ions into at least either one of said semiconductor substrate or said conductive layer.

According to still another aspect of the present invention, a method for making a semiconductor device comprises the steps of:

forming a first conductive layer in one of in and on a semiconductor substrate, forming an insulating layer on said first conductive layer, forming a second conductive layer on said insulating layer, patterning said second conductive layer, doping impurity ions into at least either one of said semiconductor substrate, and said first conductive layer and second conductive layer, and removing at least a part of said insulating layer underneath said second conductive layer at a portion where some of said impurity ions were one of implanted and passed through.

According to still another aspect of the present invention, a method for making a semiconductor device comprises the steps of:

forming a first conductive layer in one of in and on a semiconductor substrate, forming an insulating layer on said first conductive layer, forming a second conductive layer on said insulating layer, patterning said second conductive layer, removing at least a part of said insulating layer underneath said second conductive layer at the portion where some of said impurity ions are to be one of implanted and pass through in the following step, and doping impurity ions into at least either one of said semiconductor substrate said first conductive layer and second conductive layer.

According to still another aspect of the present invention, a semiconductor device comprises:

a semiconductor substrate, a first insulating layer thermally grown on said semiconductor substrate, a gate electrode formed on said first insulating layer, and spatially isolated source and drain regions formed in said semiconductor substrate, wherein side ends of said first insulating layer are positioned offset toward an inside of a side surface facing said source and drain regions.

According to still another aspect of the present invention, a semiconductor device further comprises:

a second insulating layer formed covering a side surface of said gate electrode and a side end of said first insulating layer.

According to still another aspect of the present invention, a semiconductor device includes the feature that said second insulating layer has a higher dielectric constant than said first insulating layer.

According to still another aspect of the present invention, a semiconductor device further comprises:

a third insulating layer formed on said second insulating layer.

According to still another aspect of the present invention, a semiconductor device includes the feature that a dielectric constant of said third insulating layer is substantially the same as that of said second insulating layer.

According to still another aspect of the present invention, a semiconductor device further comprises:

a second insulating layer formed beneath an end portion of said gate electrode.

According to still another aspect of the present invention, a semiconductor device includes the feature that said second insulating layer has a higher dielectric constant than said first insulating layer.

According to still another aspect of the present invention, a semiconductor device includes the feature that said first insulating layer is a thermally grown layer and said second insulating layer is a chemically grown layer.

BRIEF DESCRIPTION OF THE DRAWINGS

FIGS. 1A through 1E illustrate an exemplary embodiment of the present invention.

Figure 2:
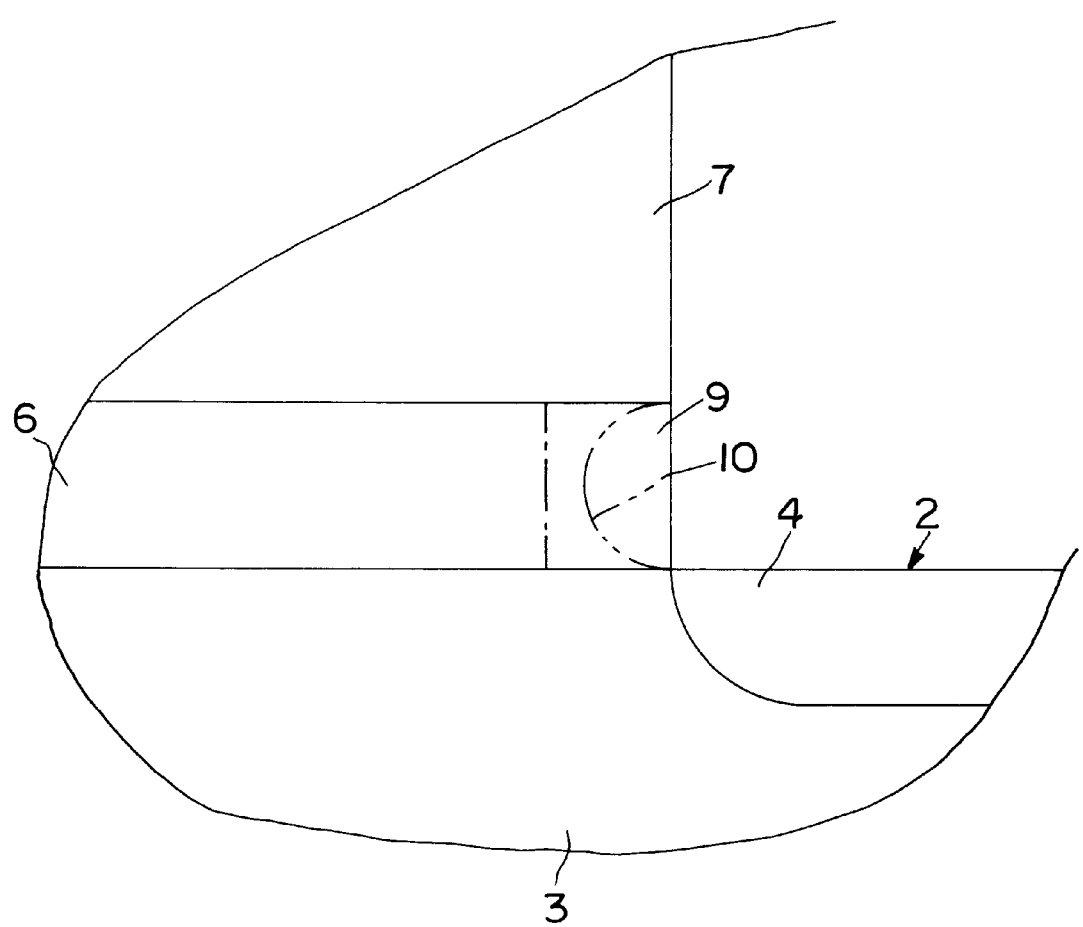
FIG. 2 is an enlarged cross-sectional view of a semiconductor device in accordance within exemplary embodiment of the present invention.

DETAILED DESCRIPTION OF THE PREFERRED EMBODIMENTS (1st embodiment)

FIGS. 1A through 1E show process steps for making a semiconductor device according to one exemplary embodiment of the present invention. The MOSFET with extensions of source/drain regions comprises a gate insulating film 6, gate electrode 7, sidewall 8 on a p-type silicon substrate 2 containing a p-well region 3, source/drain region 4 and extension region thereof 4.

First, a polycrystalline silicon film is patterned to form gate electrode 7 on a p-type silicon substrate 2 containing a p-well region 3 and a gate insulating film (such as thermally grown silicon oxide) 6 formed thereon (FIG. 1A). The thickness of the gate insulating film is from 2 to 8 nm, and the thickness of the gate electrode is from 200 to 400 nm. The gate length of the MOSFET is typically less than about 500 nm.

Next, Arsenic ions are doped as a first implantation into the silicon substrate 2 with the acceleration energy of 10 KeV at the dosage of $1\times10^{14}$ atoms/cm$^2$ to form the extension region 4 (FIG. 1B). The extension region 4 is formed at a relatively shallow portion of the silicon substrate 2 because the energy of doped ions is relatively small as 10 KeV.

In the ion implantation step, all of the ion beams are not necessarily perpendicular to the surface of the silicon substrate 2, and some of them are implanted with off-perpendicular angles. Furthermore, there is no protective structure for shielding the side end portion of the gate insulating film 6 and the gate electrode 7 from the ion bombardment. With such a structure and high dosage ion implantation as $1\times10^{14}$ atoms/cm$^2$, off-perpendicular ion beams directly strike into the gate insulating film 6 right under the side end portion of the gate electrode 7. The beams can also strike the gate insulating film 6 after passing through the side end portion of the gate electrode 7. Thus, as shown in FIG. 2, a damaged layer 9 is formed in the gate insulating film 6 positioned under the side end portion of the gate electrode 7 due to the physical damage caused by the ion beams strike. FIG. 2 defined the border between the gate insulating film 7 and the damaged layer 9. Actually however, the gate insulating film is damaged most seriously at the portion adjacent to the side end surface and the damage becomes less and less serious at the inner portion, which means there is no clear border. The damaged layer 9 not only degrades the performance of the MOSFET, but could be a cause of insulator breakdown.

To solve this problem, the damaged layer 9 is selectively removed by wet etching with 3% aqua solution of hydrogen fluoride for about one minute. Degradation of the performance can be prevented by removing at least the most seriously damaged portion of the damaged layer 9 (portion adjacent to the exposed surface positioned under the side end of the gate electrode 7). The damaged layer 9 can be removed by wet etching up to the curved border 10a in FIG. 2 or can also be unisotropically etched up to linear border 10b either of which is sufficient to prevent degradation due to the damaged layer. For MOSFETs with a gate insulating film of from 2 to 8 nm thick, it is preferable to remove the damaged layer up to about 5 to 20 nm deep inside from both side ends of the gate electrode.

Wet etching allows selective etching of the damaged layer without causing any damage to the gate electrode made of polycrystalline silicon, for example. The damaged layer 9 shows a higher wet etching rate than the damage-free gate insulating film 6, so the etching rate drops sharply after damaged layer 9 has been removed.

This allows the wet etching to proceed in a 'self-stop' manner so to speak.

After the removal of the damaged layer by wet etching, the device is water-rinsed and dried.

A silicon oxide film of about 120 nm is formed by chemical vapor deposition and then etched to form sidewall 8 (FIG. 1D).

Further, a second ion implantation of Arsenic ions is carried out with the acceleration energy of 30 KeV at the dosage of $3\times10^{15}$ atoms/cm$^2$ to form source/drain region 5 in the silicon substrate 2 (FIG. 1E). The source/drain region 5 will be deeper than the extension region 4 because the source/drain region is formed by the relatively high energy ion implantation of 30 KeV.

In this step, both ends of the gate electrode 7 and the extension region 4 positioned right below the side end of the gate electrode are covered by the sidewall 8, and the second ion implantation will not physically damage the gate insulating film 6. The impurity concentration of the extension region 4 adjacent to the gate electrode 6 will not be increased excessively because of the covering by sidewall 8.

A MOSFET with extensions of the source/drain region is fabricated by the aforementioned process. In the MOSFET, the gate insulating film is free from damage-induced degradation or breakdown, because the damaged layer 9 formed in the gate insulating film 6 by the second ion implantation has been removed by the wet etching.

Following are the descriptions of the experiments leading to examine the results of the present invention. Samples are prepared by the process of the aforementioned embodiment unless specified otherwise.

(experiment conditions)

*Evaluation of the damage of the gate insulating film: constant voltage TDDB test
*Ion implantation equipment: PI-9500(AMJ)
*Ion doping: $BF_2^+$, 40 KeV.$1\times10^{15}$ atoms/cm$^2$
*Thickness of gate insulating film: 8 nm
*Thickness of gate electrode: 330 nm
*Applied voltage: 10 V
*Area of capacitor: 0.8 $\mu m^2$ (results)

Figure 3:
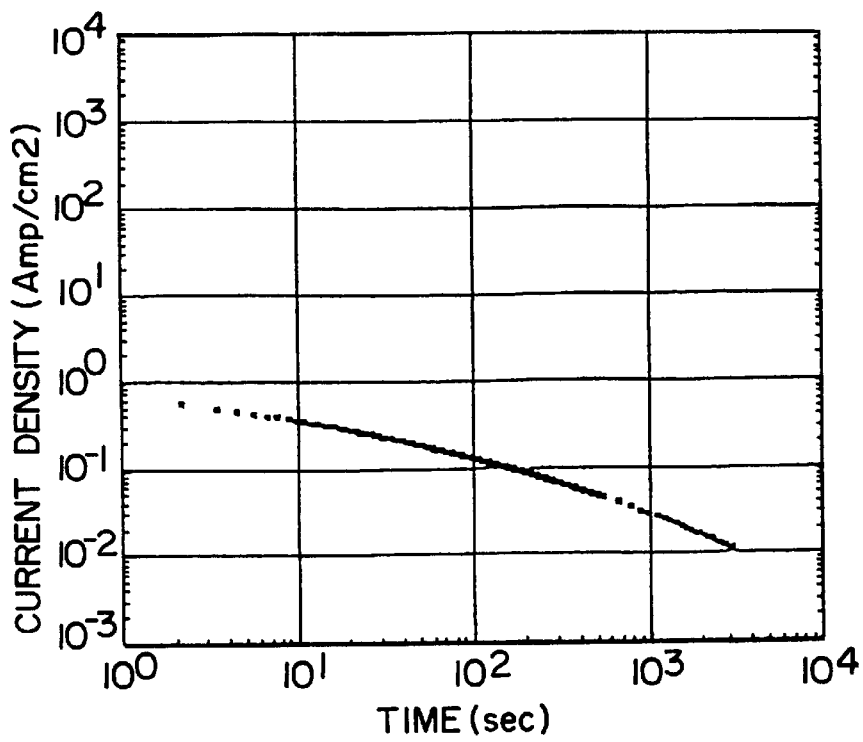
FIG. 3 through 7 are the constant voltage TDDB (Time Dependent Dielectric Breakdown) characteristics for MOS structure samples.
Figure 4:
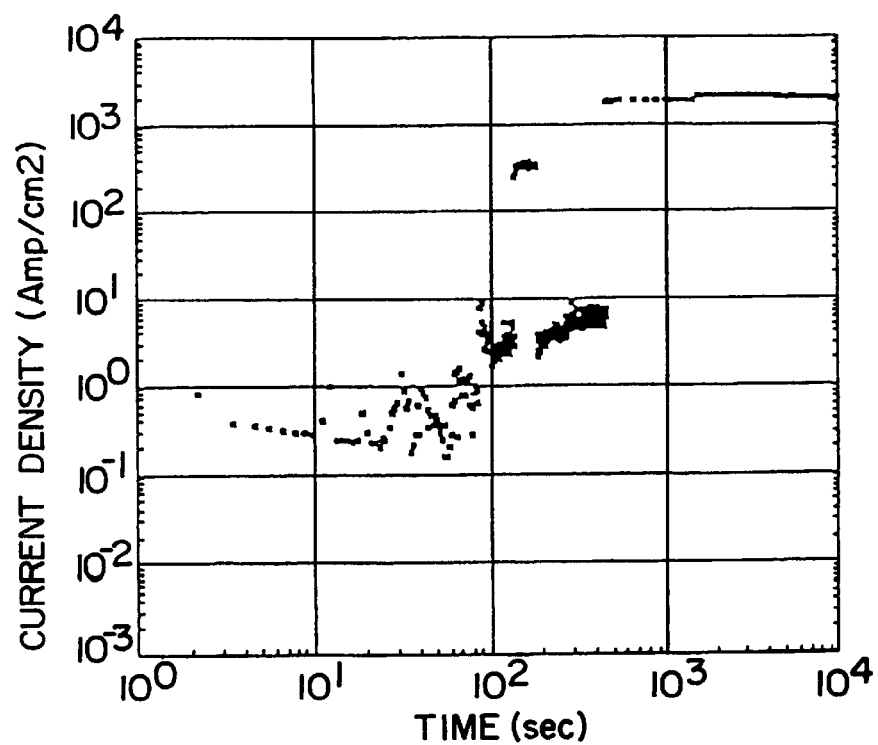

FIGS. 3 through 7 show the current between the gate electrode and semiconductor substrate plotted against time. FIG. 3 is for a sample without ion implantation. FIGS. 4 to 7 are for ion-implanted samples that went through wet etching of the damaged layer for the period of 0 (no wet etching), 30, 90, and 120 seconds respectively.

Figure 5:
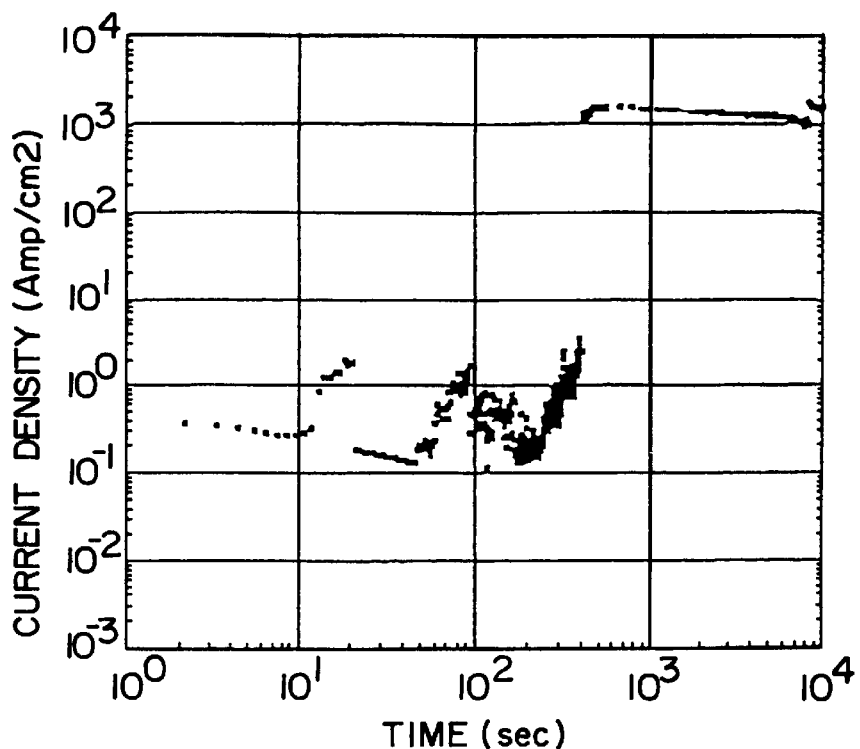
Figure 6:
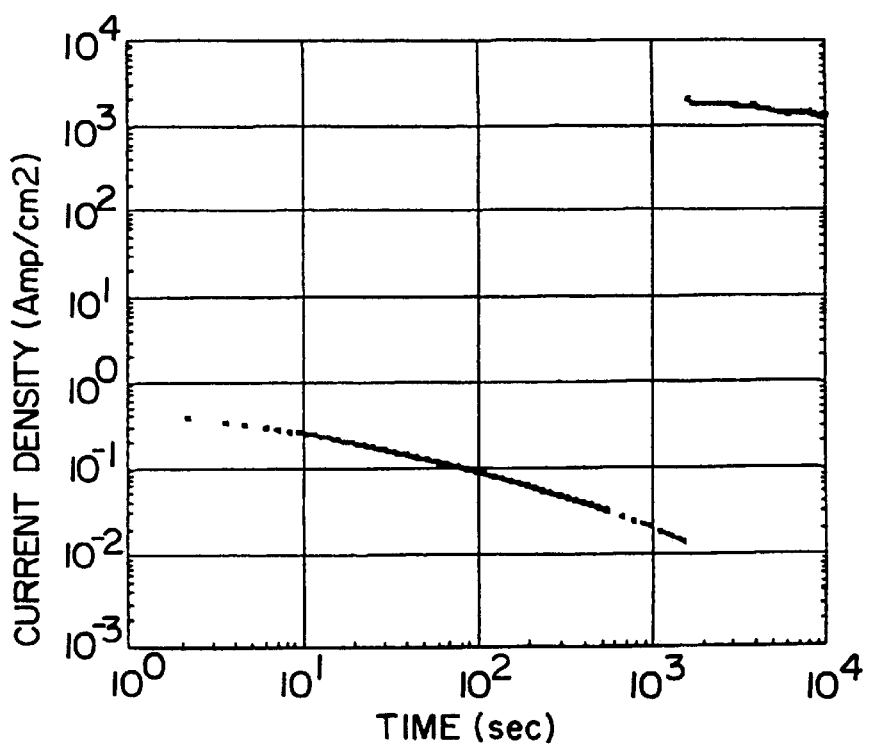
Figure 7:
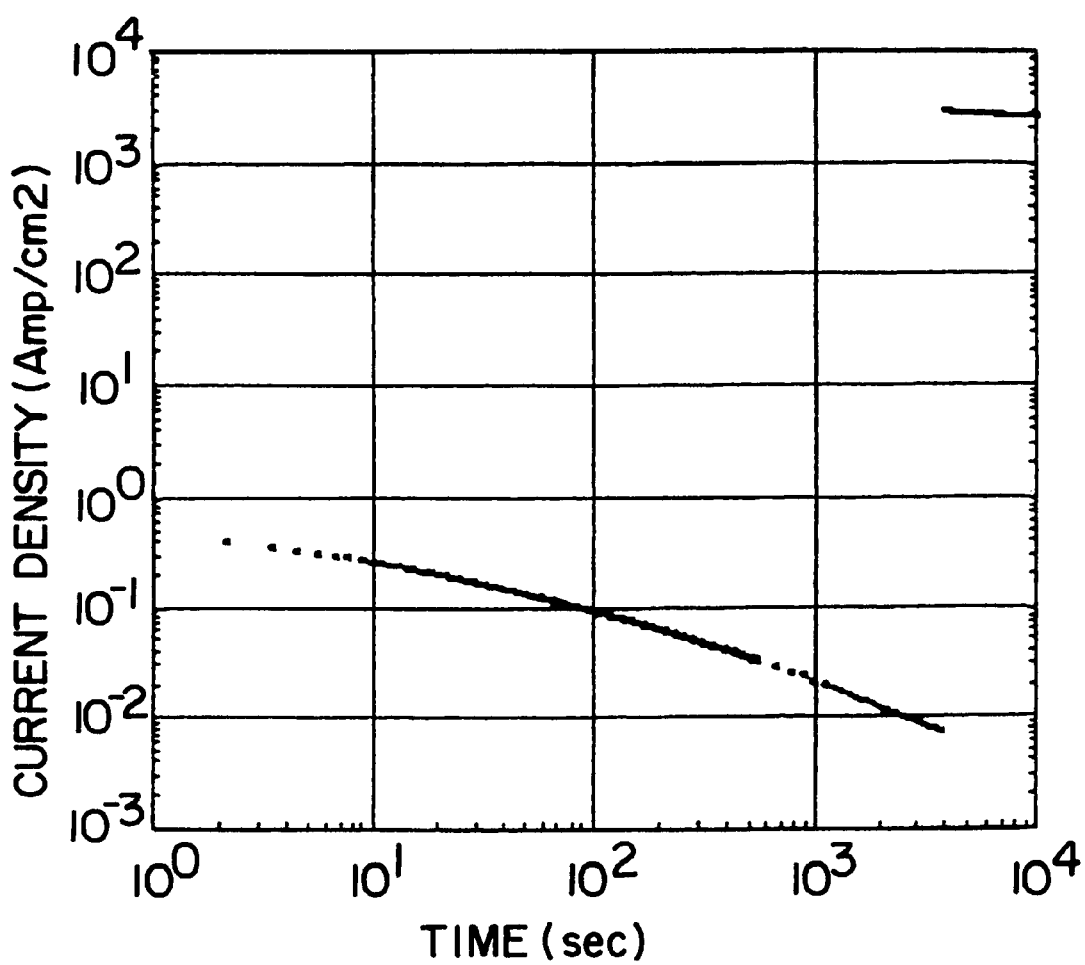

In the sample without wet etching, the leakage current increased as the time passed. Breakdown of the insulating film was observed after about 500 seconds of voltage stress (FIG. 4) The sample with 30-second wet etching showed no significant improvement (FIG. 5).

In contrast, for samples with 90 or 120-second wet etching (FIGS. 6 and 7), the leakage current stayed at substantially the same order as the sample with no ion implantation. The gate insulating film was removed by the wet etching of the period of 30, 90, or 120 seconds, to the depth of about 5, 8, or 10 nm from the side end of the gate electrode.

The ion-doped sample with no wet etching containing a damaged layer formed in the gate insulating film caused by doping or passing the impurity ions showed a larger leakage current and breakdown at the early stage. In contrast, wet etching for a certain period of time successfully removes the damaged layer and leaves the gate insulating film in substantially the same quality as non-doped samples. Thus, with a fabrication process according to the present invention, it is possible to prevent performance degradation of a MOSFET and to prevent breakdown of the gate insulating film.

(second embodiment)

FIGS. 8A through 8E illustrate a second method embodiment in which a MOSFET with an extension of the source/drain region as in the first embodiment.

The basic structure of the MOSFET is same as that of the first embodiment, and same elements are indicated with same numbers. Dimensions are the same unless specified otherwise.

Figure 8A:
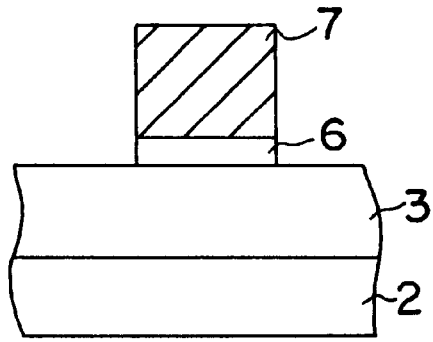
FIGS. 8A through 19E illustrate various method embodiments for making semiconductor devices according to exemplary embodiments of the present invention.
Figure 8B:
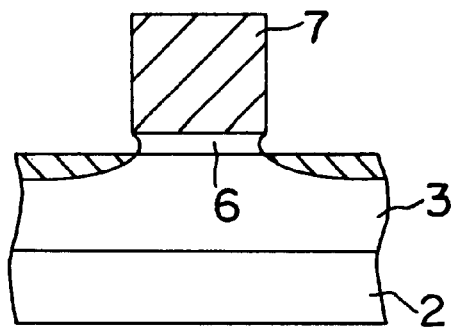

First, a gate electrode 7 is formed on a p-type silicon substrate 2 containing a p-well region 3 and a gate insulating film 6 formed thereon (FIG. 8A). Then the silicon wafer is dipped into a 3% aqua solution of hydrogen fluoride for about one minute. In this wet etching step, a portion of the gate insulating film 7, where physical damage is expected to arise, is removed. That is, the portion where impurity ions will strike or pass through in the following ion implantation step. Specifically, the portion of the gate insulating film 6 positioned right under the side ends of the gate electrode 7 is removed. Degradation of the gate insulating film can be prevented by removing at least the portion where the most serious damage is expected (portion adjacent to the exposed surface positioned under the side end of the gate electrode 7). For MOSFETs with gate insulating film of from 2 to 8 nm thick, it is preferable to remove the damaged layer up to about 5 to 20 nm deep inside from both side ends of the gate electrode. The insulating film can be removed by wet etching up to the curved border like 10*a* in FIG. 2, or can also be unisotropically etched up to linear border 10*b*, either of which is sufficient to prevent degradation of the insulating film. The silicon wafer is water-rinsed and dried after the etching step.

Figure 8C:
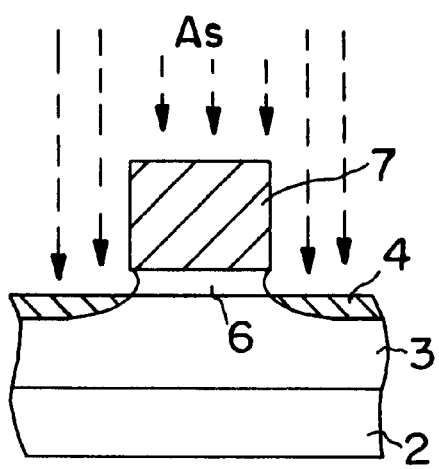

Next, Arsenic ions are doped as a first implantation into the silicon substrate 2 with the acceleration energy of 10 KeV at a dosage of $1\times10^{14}$ atoms/cm$^2$ to form an extension region 4 (FIG. 8C). The ion implantation will not physically damage the gate insulating film 6 because the portion subject to the ion bombardment has been removed in the previous etching step.

Figure 8D:
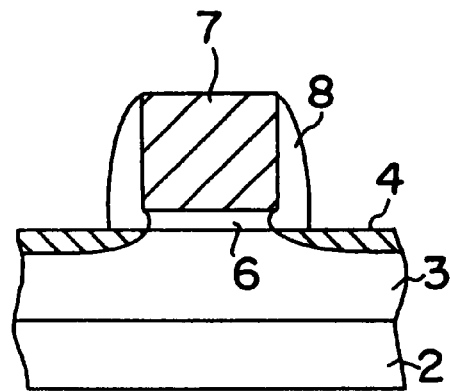

Then, a silicon oxide layer 120 nm thick is formed over the silicon substrate. The silicon oxide film is etched to fabricate sidewall 8 (FIG. 8D).

Figure 8E:
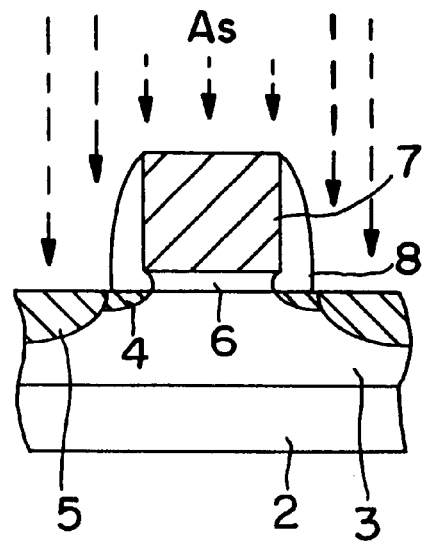

Further, a second ion implantation of As ions is carried out with an acceleration energy of 30 KeV at a dosage of $3\times10^{15}$ atoms/cm$^2$ to form source/drain region 5 (FIG. 8E). The second ion implantation will not physically damage the gate insulating film 6 because the portion subject to the ion bombardment has been removed in the previous etching step, and furthermore, side end portion of the gate insulating film is covered by the sidewall 8.

A MOSFET with extensions of the source/drain region is fabricated by the aforementioned process. In the MOSFET, the gate insulating film is free from damage-induced degradation or breakdown.

(third embodiment)

Figure 9A:
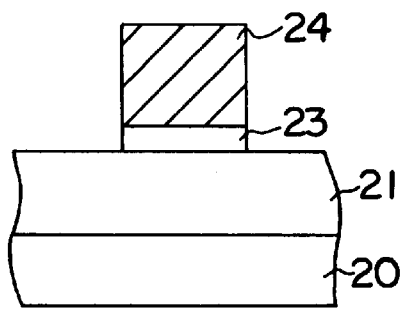
Figure 9B:
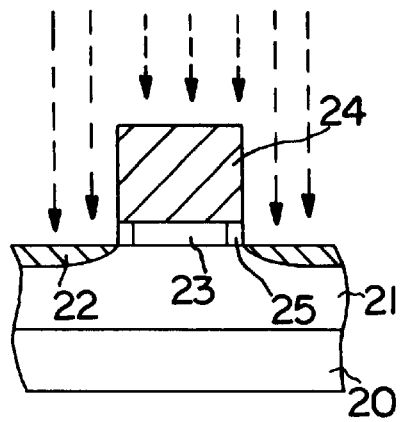
Figure 9C:
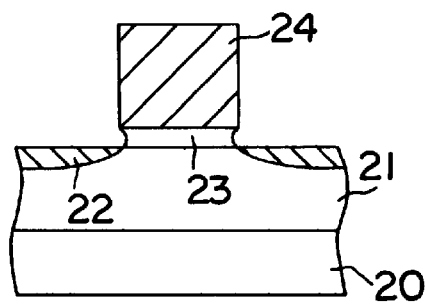

FIGS. 9A through 9C show process steps for making a semiconductor device according to another embodiment of the present invention. The MOSFET with single source/drain regions comprises a gate insulating film 23, gate electrode 24, on a p-type silicon substrate 20 containing a p-well region 21, and single source/drain regions 22. Dimensions are the same as the previous embodiment unless defined otherwise.

First, a polycrystalline silicon film is patterned to form gate electrode 24 on a p-type silicon substrate 20 containing a p-well region 21 and a gate insulating film (such as thermally grown silicon oxide) 23 formed thereon (FIG. 9A).

Next, Arsenic ions are doped into the silicon substrate 20 with an acceleration energy of 10 KeV at a dosage of $3 \times 10^{15}$ atoms/cm$^2$ to form single source/drain regions 22 (FIG. 9B). The single source/drain regions 22 are formed at a relatively shallow portion of the silicon substrate 20 because the energy of doped ions is relatively small, such as 10 KeV.

In the ion implantation step, by the mechanism set forth above, a physically-damaged layer 25 is formed in the gate insulating film 23 positioned under the side end portion of the gate electrode 24 due to the physical damage caused by the ion beams strike.

To solve this problem, the damaged layer 25 is selectively removed by wet etching with a 3% aqua solution of hydrogen fluoride for about one minute (FIG. 9C). After the removal of the damaged layer by wet etching, the device is water-rinsed and dried.

A MOSFET with single source/drain regions is fabricated by the aforementioned process. In the MOSFET, the gate insulating film is free from damage-induced degradation or breakdown, because the damaged layer 25 formed in the gate insulating film 23 by the ion implantation has been removed by the wet etching.

(fourth embodiment)

Figure 10A:
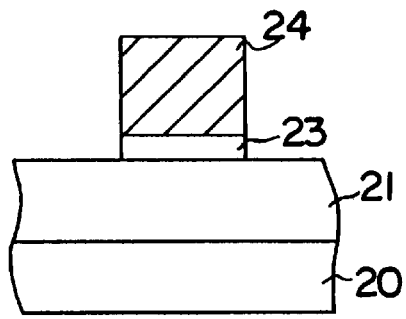
Figure 10B:
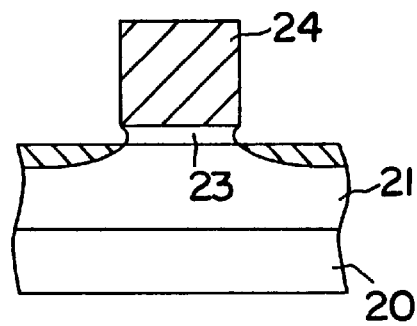
Figure 10C:
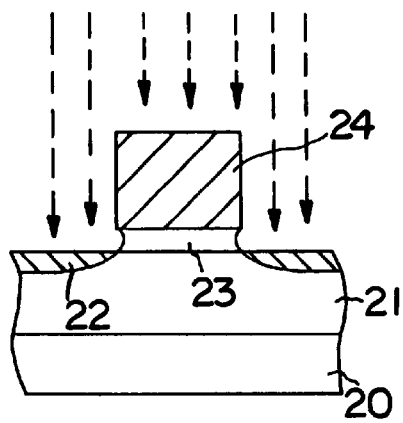

FIGS. 10A through 10C illustrate still another method embodiment in which a MOSFET with single source/drain regions as in the third embodiment. The asic structure of the MOSFET is same as that of the third embodiment, and the same elements are indicated with the same numbers.

First, a gate electrode 24 is formed on a p-type silicon substrate 20 containing a p-well region 21 and a gate insulating film 23 formed thereon (FIG. 10A). Dimensions are the same unless specified otherwise.

Then the silicon wafer is dipped into a 3% aqua solution of hydrogen fluoride for about one minute. In this wet etching step, a portion of the gate insulating film 23 where physical damage is expected to arise is removed. That is, the portion where impurity ions will strike or pass through in the following ion implantation step. Specifically, the portion of the gate insulating film 23 positioned right under the side ends of the gate electrode 24 is removed (FIG. 10B). Degradation of the gate insulating film can be prevented by removing at least the portion where the most serious damage is expected (portion adjacent to the exposed surface positioned under the side end of the gate electrode 24). For MOSFETs with a gate insulating film of from 2 to 8 nm thick, it is preferable to remove the damaged layer up to about 5 to 20 nm deep inside from both side ends of the gate electrode. The silicon wafer is then water-rinsed and dried after the etching step.

Next, Arsenic ions are doped as an implantation into the silicon substrate 20 with an acceleration energy of 10 KeV at a dosage of $3 \times 10^{15}$ atoms/cm$^2$ to form the single source/drain regions 22 (FIG. 10C).

The single source/drain regions 22 is formed at a relatively shallow portion of the silicon substrate 20 because the energy of doped ions is relatively small, such as 10 KeV. The ion implantation will not physically damage the gate insulating film 6 because the portion subject to the ion bombardment has been removed in the previous etching step.

A MOSFET with single source/drain regions is fabricated by the aforementioned process. In the MOSFET, the gate insulating film is free from damage-induced degradation or breakdown.

(fifth embodiment)

Figure 11A:
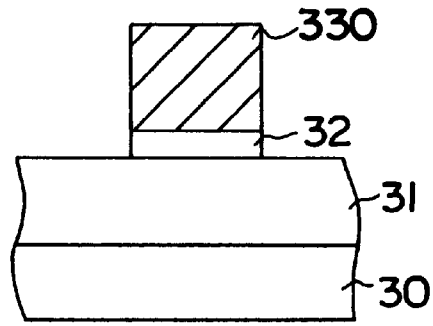
Figure 11B:
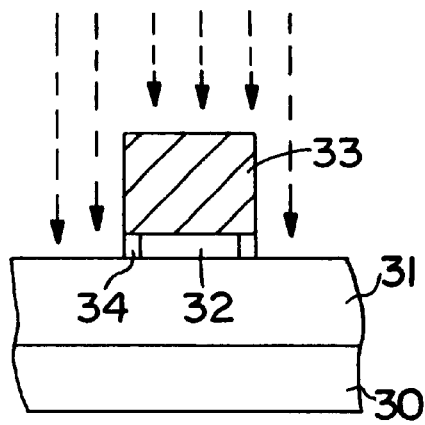
Figure 11C:
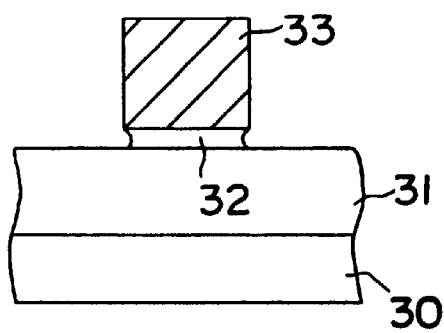

FIGS. 11A through 11C show process steps for making a semiconductor device, more particularly a MOS capacitor, according to another embodiment of the present invention. The MOS capacitor comprises a capacitor insulating film 32 and a capacitor electrode 33 on a p-type silicon substrate 30 containing a p-well region 31 therein. The p-well region 31 works as a capacitor electrode facing the capacitor electrode 33. The thickness of the capacitor insulating film 32 is about 6 nm, and the thickness of the capacitor electrode 33 is about 200 nm. The area of the electrode is determined according to required capacitance.

First, a polycrystalline silicon pattern 330 is formed on a p-type silicon substrate 30 containing a p-well region 31 and a capacitor insulating film (such as thermally grown silicon oxide) 32 formed thereon (FIG. 11A). Next, arsenic ions are doped with an acceleration energy of 10 KeV at a dosage of $3 \times 10^5$ atoms/cm$^2$ to provide the polycrystalline silicon pattern 330 with conductivity (FIG. 11B). Thus the polycrystalline silicon pattern 330 becomes conductive and works as the capacitor electrode 33.

In the ion implantation step, by the mechanism set forth above, a physically-damaged layer 34 is formed in the capacitor insulating film 32 positioned under the side end portion of the capacitor electrode 33 due to the physical damage caused by the ion beams strike.

To solve this problem, the damaged layer 34 is selectively removed by wet etching with a 3% aqua solution of hydrogen fluoride for about one minute. After the removal of the damaged layer by wet etching, the device is water-rinsed and dried (FIG. 11C).

A MOS capacitor is fabricated by the aforementioned process. In the MOS capacitor, the capacitor insulating film is free from damage-induced degradation or breakdown, because the damaged layer 34 formed in the capacitor insulating film 32 by the ion implantation has been removed by the wet etching. For MOS capacitors with a capacitor insulating film of from 2 to 8 nm thick, it is preferable to remove the damaged layer up to about 5 to 20 nm deep inside from both side ends of the capacitor electrode.

(sixth embodiment)

Figure 12A:
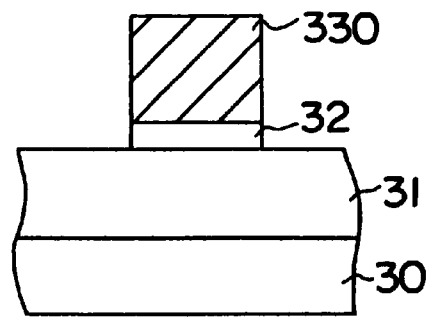
Figure 12B:
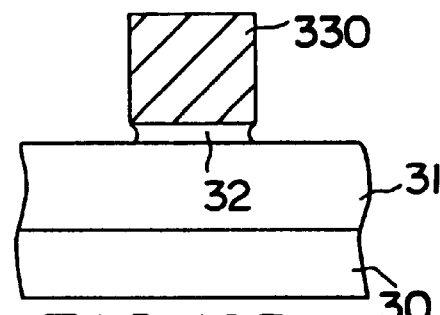
Figure 12C:
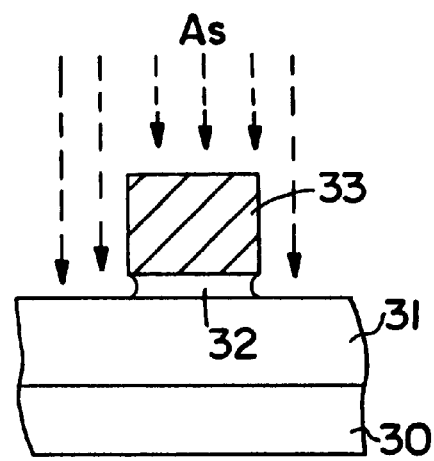

FIGS. 12A through 12C illustrate still another method embodiment for making a MOS capacitor as in the fifth embodiment. The basic structure of the MOS capacitor is same as that of the fifth embodiment, and the same elements are indicated with the same numbers.

First, a polycrystalline silicon pattern 330 is formed on a p-type silicon substrate 30 containing a p-well region 31 and a capacitor insulating film (such as thermally grown silicon oxide) 32 formed thereon (FIG. 12A). Dimensions are the same unless specified otherwise.

Then the silicon wafer is dipped into a 3% aqua solution of hydrogen fluoride for about one minute. In this wet etching step, a portion of the capacitor insulating film 32 where physical damage is expected to arise is removed. That is the portion where impurity ions will strike or pass through in the following ion implantation step. Specifically, the portion of the capacitor insulating film 32 positioned right under the side ends of the polycrystalline silicon pattern 330 is removed (FIG. 12B) Degradation of the capacitor insulating film can be prevented by removing at least the portion where the most serious damage is expected (portion adjacent to the exposed surface positioned under the side end of the polycrystalline silicon pattern 330). The silicon wafer is then water-rinsed and dried after the etching step.

Next, arsenic ions are doped with an acceleration energy of 10 KeV at a dosage of $3 \times 10^{15}$ atoms/cm$^2$ to provide the polycrystalline silicon pattern 330 with conductivity (FIG. 12C). Thus, the polycrystalline silicon pattern 330 becomes conductive and works as the capacitor electrode 33. The ion implantation will not physically damage the capacitor insulating film 32 because the portion subject to the ion bombardment has been removed in the previous etching step.

A MOS capacitor is fabricated by the aforementioned process. In the MOS capacitor, the capacitor insulating film is free from damage-induced degradation or breakdown, because the portion subject to the ion bombardment has been removed in the previous etching step. For MOS capacitors with capacitor insulating film of from 2 to 8 nm thick, it is preferable to remove the damaged layer up to about 5 to 20 nm deep inside from both side ends of the capacitor electrode.

(seventh embodiment)

Figure 13A:
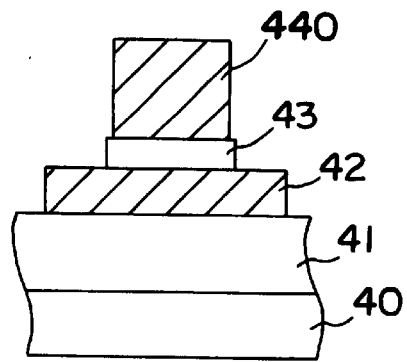
Figure 13B:
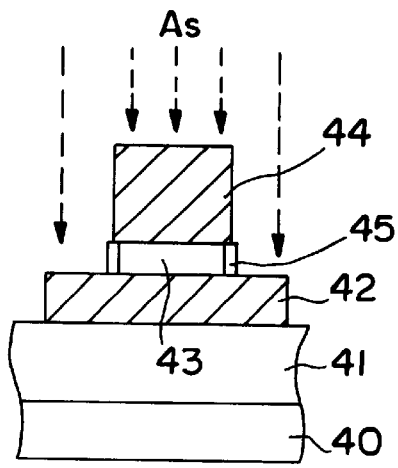
Figure 13C:
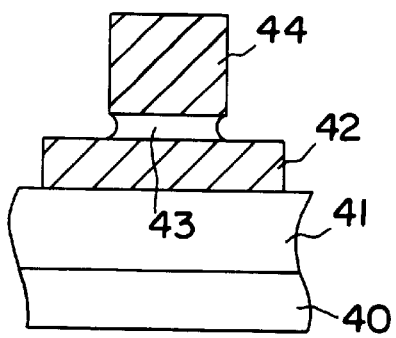

FIGS. 13A through 13C show process steps for making a semiconductor device, more particularly a MOS capacitor, according to another embodiment of the present invention. The MOS capacitor comprises a capacitor lower electrode 42, a capacitor insulating film 43 and a capacitor upper electrode 44 on a p-type silicon substrate 40 containing a p-well region 41 therein. The thickness of the capacitor insulating film 43 is about 6 nm, the thickness of the capacitor electrodes 42 and 44 is about 200 nm. The area of the electrodes is determined according to required capacitance.

First, a polycrystalline silicon is patterned to form a capacitor lower electrode 42 on a p-type silicon substrate 40 containing a p-well region 41. Then a capacitor insulating film 43 is formed on the capacitor lower electrode 42. And a polycrystalline silicon pattern 440 is formed on the capacitor insulating film 43 (FIG. 13A).

Next, arsenic ions are doped with an acceleration energy of 10 KeV at a dosage of $3 \times 10^{15}$ atoms/cm$^2$ to provide the polycrystalline silicon pattern 440 with conductivity (FIG. 13B). Thus the polycrystalline silicon pattern 440 becomes conductive and works as the capacitor upper electrode 44.

In the ion implantation step, by the mechanism set forth above, a physically damaged layer 45 is formed in the capacitor insulating film 43 positioned under the side end portion of the capacitor upper electrode 44 due to the physical damage caused by the ion beams strike.

To solve this problem, the damaged layer 45 is selectively removed by wet etching with a 3% aqua solution of hydrogen fluoride for about one minute (FIG. 13C). After the removal of the damaged layer by wet etching, the device is water-rinsed and dried.

A MOS capacitor is fabricated by aforementioned process. In the MOS capacitor, the capacitor insulating film is free from damage-induced degradation or breakdown, because the damaged layer 45 formed in the capacitor insulating film 43 by the ion implantation has been removed by the wet etching. For MOS capacitors with capacitor insulating film of from 2 to 8 nm thick, it is preferable to remove the damaged layer up to about 5 to 20 nm deep inside from both side ends of the capacitor electrode.

(eighth embodiment)

Figure 14A:
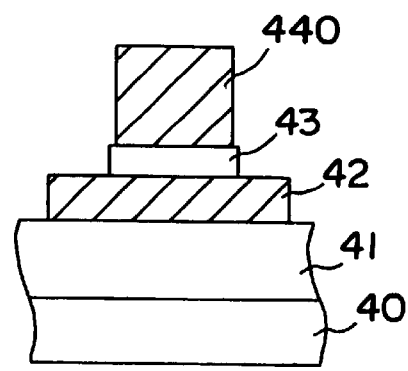
Figure 14B:
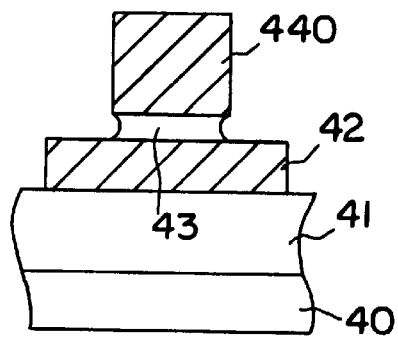
Figure 14C:
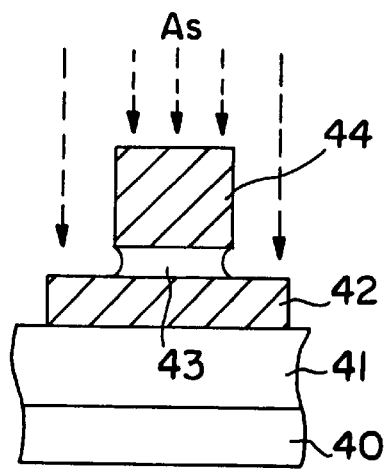

FIGS. 14A through 14C illustrate still another method embodiment for making a MOS capacitor as in the seventh embodiment. The asic structure of the MOS capacitor is the same as that of the seventh embodiment, and the same elements are indicated with the same numbers. Dimensions are the same as the seventh embodiment unless specified otherwise.

First, a polycrystalline silicon is patterned to form a capacitor lower electrode 42 on a p-type silicon substrate 40 containing a p-well region 41. Then a capacitor insulating film 43 is formed on the capacitor lower electrode 42. And a polycrystalline silicon pattern 440 is formed on the capacitor insulating film 43 (FIG. 14A).

Then the silicon wafer is dipped into a 3% aqua solution of hydrogen fluoride for about one minute. In this wet etching step, a portion of the capacitor insulating film 43 where physical damage is expected to arise is removed. That is, the portion where impurity ions will strike or pass through in the following ion implantation step. Specifically, the portion of the capacitor insulating film 43 positioned right under the side ends of the polycrystalline silicon pattern 440 is removed (FIG. 14B) Degradation of the capacitor insulating film can be prevented by removing at least the portion where most serious damage is expected (portion adjacent to the exposed surface positioned under the side end of the polycrystalline silicon pattern 440). It is preferable to remove the damaged layer up to about 5 to 20 nm deep inside from both side ends of the polycrystalline silicon pattern 440. The silicon wafer is then water-rinsed and dried after the etching step.

Next, arsenic ions are doped with an acceleration energy of 10 KeV at a dosage of $3 \times 10^{15}$ atoms/cm$^2$ to provide the polycrystalline silicon pattern 440 with conductivity (FIG. 14C). Thus the polycrystalline silicon pattern 440 becomes conductive and works as the capacitor upper electrode 44. The ion implantation will not physically damage the capacitor insulating film 43 because the portion subject to the ion bombardment has been removed in the previous etching step.

A MOS capacitor is fabricated by the aforementioned process. In the MOS capacitor, the capacitor insulating film is free from damage-induced degradation or breakdown, because the portion subject to the ion bombardment has been removed in the previous etching step.

(ninth embodiment)

Figure 15A:
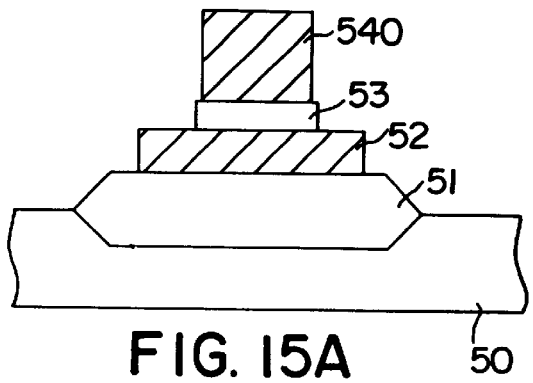
Figure 15B:
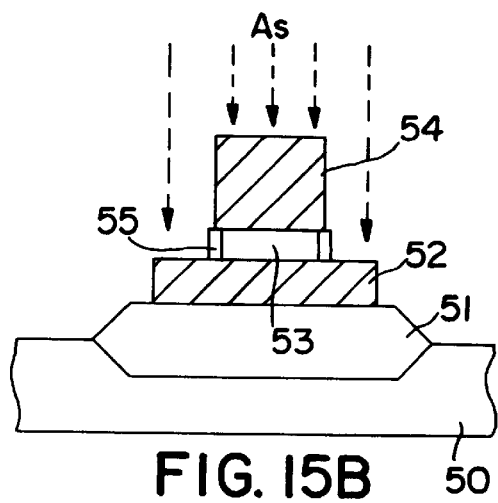
Figure 15C:
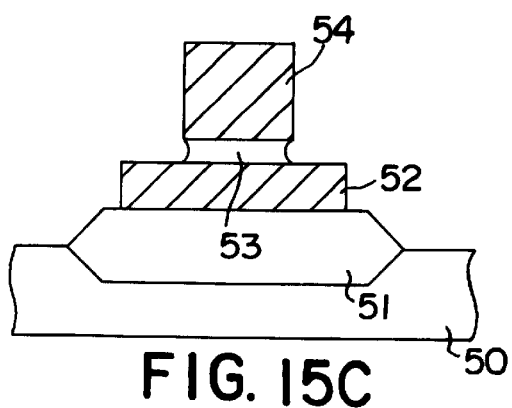

FIGS. 15A through 15C show process steps for making a semiconductor device, more particularly a MOS capacitor, according to another embodiment of the present invention. The MOS capacitor comprises a capacitor lower electrode 52, a capacitor insulating film 53 and a capacitor upper electrode 54 on a p-type silicon substrate 50 having a silicon oxide layer for device isolation (LOCOS) 51 thereon. Dimensions are the same as the previous embodiment unless specified otherwise.

First, a polycrystalline silicon is patterned to form a capacitor lower electrode 52 on a p-type silicon substrate 50 having a LOCOS 51. Then a capacitor insulating film 53 is formed on the capacitor lower electrode 52. And a polycrystalline silicon pattern 540 is formed on the capacitor insulating film 53 (FIG. 15A).

Next, arsenic ions are doped with an acceleration energy of 10 KeV at a dosage of $3 \times 10^{15}$ atoms/cm$^2$ to provide the polycrystalline silicon pattern 540 with conductivity (FIG. 15B). Thus the polycrystalline silicon pattern 540 becomes conductive and works as the capacitor upper electrode 54.

In the ion implantation step, by the mechanism set forth above, a physically-damaged layer 55 is formed in the capacitor insulating film 53 positioned under the side end portion of the capacitor upper electrode 54 due to the physical damage caused by the ion beams strike.

To solve this problem, the damaged layer 55 is selectively removed by wet etching with a 3% aqua solution of hydrogen fluoride for about one minute (FIG. 15C). After the removal of the damaged layer by wet etching, the device is water-rinsed and dried.

A MOS capacitor is fabricated by the aforementioned process. In the MOS capacitor, the capacitor insulating film is free from damage-induced degradation or breakdown, because the damaged layer 55 formed in the capacitor insulating film 53 by the ion implantation has been removed by the wet etching. For MOS capacitors with a capacitor insulating film of from 2 to 8 nm thick, it is preferable to remove the damaged layer up to about 5 to 20 nm deep inside from both side ends of the capacitor upper electrode.

(tenth embodiment)

Figure 16A:
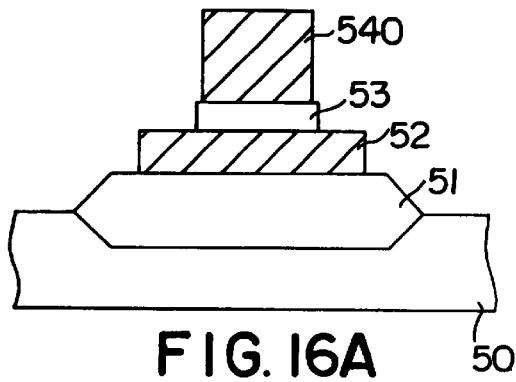
Figure 16B:
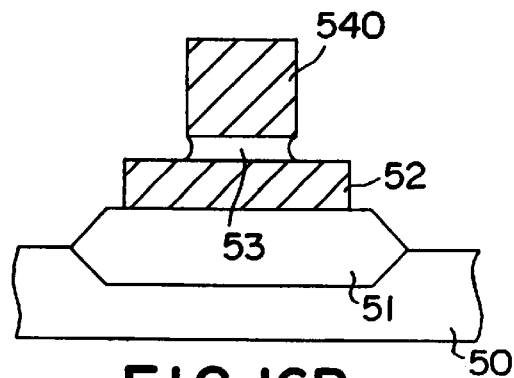
Figure 16C:
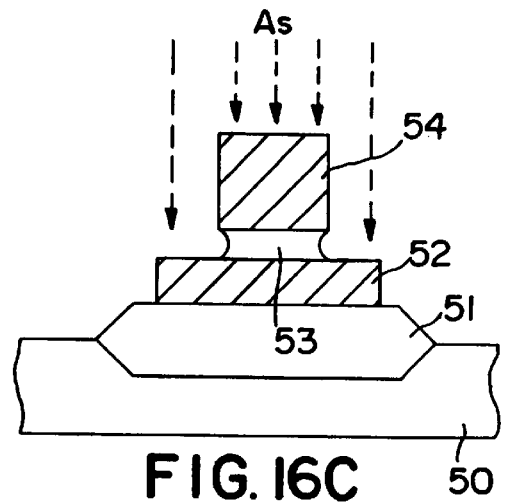

FIGS. 16A through 16C illustrate still another method embodiment for making a MOS capacitor as in the seventh embodiment. Basic structure of the MOS capacitor is the same as that of the ninth embodiment, and the same elements are indicated with the same numbers. Dimensions are the same as the seventh embodiment unless specified otherwise.

First, a polycrystalline silicon is patterned to form a capacitor lower electrode 52 on a p-type silicon substrate 50 having a LOCOS 51. Then a capacitor insulating film 53 is formed on the capacitor lower electrode 52 and a polycrystalline silicon pattern 540 is formed on the capacitor insulating film 53 (FIG. 16A).

Then the silicon wafer is dipped into a 3% aqua solution of hydrogen fluoride for about one minute. In this wet etching step, a portion of the capacitor insulating film 53 where physical damage is expected to arise is removed. That is, the portion where impurity ions will strike or pass through in the following ion implantation step. Specifically, the portion of the capacitor insulating film 53 positioned right under the side ends of the polycrystalline silicon pattern 540 is removed (FIG. 16B) Degradation of the capacitor insulating film can be prevented by removing at least the portion where the most serious damage is expected (portion adjacent to the exposed surface positioned under the side end of the polycrystalline silicon pattern 540). It is preferable to remove the damaged layer up to about 5 to 20 nm deep inside from both side ends of the polycrystalline silicon pattern 540. The silicon wafer is then water-rinsed and dried after the etching step.

Next, arsenic ions are doped with an acceleration energy of 10 KeV at a dosage of $3\times10^{15}$ atoms/cm$^2$ to provide the polycrystalline silicon pattern 540 with conductivity (FIG. 16C). Thus the polycrystalline silicon pattern 540 becomes conductive and works as the capacitor upper electrode 54. The ion implantation will not physically damage the capacitor insulating film 53 because the portion subject to the ion bombardment has been removed in the previous etching step.

A MOS capacitor is fabricated by the aforementioned process. In the MOS capacitor, the capacitor insulating film is free from damage-induced degradation or breakdown, because the portion subject to the ion bombardment has been removed in the previous etching step.

In the description of the 5th to 10th embodiments, physical damage in insulating films 32, 43, and 53 are formed in the ion implantation steps for providing the conductivity to polycrystalline silicon patterns 330, 440, and 540, respectively However, the physical damage can be built in the ion implantation steps for fabricating other devices on the same substrate along with the MOS capacitors. In such cases, damaged layer can be removed, or the portion at the risk of ion beam damage can be removed, prior to the doping steps as mentioned in the aforementioned embodiments of the present invention to achieve like results.

(eleventh embodiment)

FIGS. 17A through 17F show process steps for making a semiconductor device according to another embodiment of the present invention. The MOSFET has a structure similar to that of the first embodiment (FIG. 1A–1E). A new feature of this embodiment is the sidewall 55 is made of silicon nitride instead of silicon oxide as in the first embodiment. The basic structure of the MOSFET is same as that of the first embodiment, and the same elements are indicated with the same numbers. Dimensions are the same unless specified otherwise.

Figure 17A:
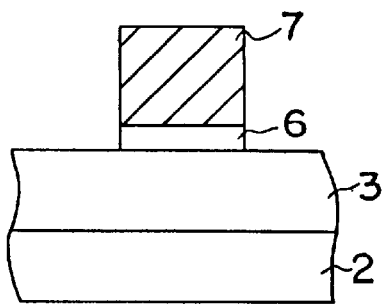
Figure 17D:
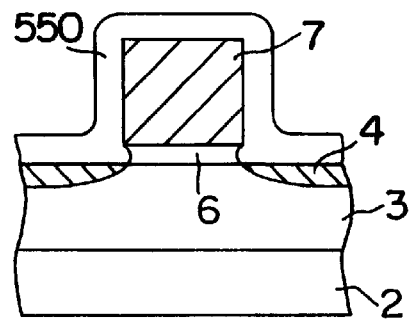
Figure 17B:
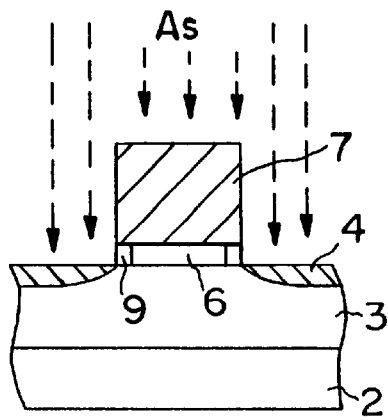

First, a polycrystalline silicon film is patterned to form gate electrode 7 on a p-type silicon substrate 2 containing a p-well region 3 and a gate insulating film (such as thermally grown silicon oxide) 6 formed thereon (FIG. 17A). Next, arsenic ions are doped as a first implantation into the silicon substrate 2 with an acceleration energy of 10 KeV at a dosage of $1\times10^{14}$ atoms/cm$^2$ to form the extension region 4 (FIG. 17B). The extension region 4 is formed at relatively shallow portion of the silicon substrate 2 because the energy of doped ions is relatively small, such as 10 KeV.

The damage layer 9, formed in the ion implantation step, not only degrades the performance of the MOSFET, but could be a cause of insulator breakdown.

To solve this problem, the damaged layer 9 is selectively removed by wet etching with a 3% aqua solution of hydrogen fluoride for about one minute. For MOSFETs with a gate insulating film of from 2 to 8 nm thick, it is preferable to remove the damaged layer up to about 5 to 20 nm deep inside from both side ends of the gate electrode (FIG. 17C).

Wet etching allows selective etching of the damaged layer without causing any damage to the gate electrode made of such as polycrystalline silicon, for example.

After the removal of the damaged layer by wet etching, the device is water-rinsed and dried.

Then, a silicon nitride film 550 of about 120 nm is formed by chemical vapor deposition over the silicon substrate 2. (FIG. 17D).

The silicon nitride has a higher dielectric constant than the silicon oxide that forms the gate insulating film 6. In this deposition step, the recess space formed after the etching of the damaged layer 9 is filled with the silicon nitride 550. The border between the silicon oxide (gate insulating film 6) and the silicon nitride 550 is at the inner position from the side ends of the gate electrode 7.

Figure 17E:
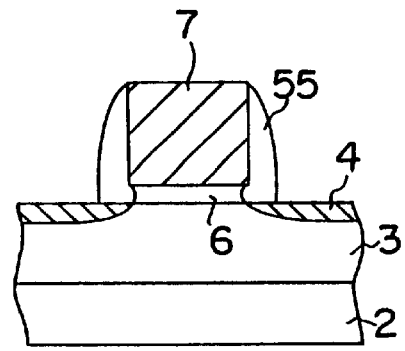
Figure 17C:
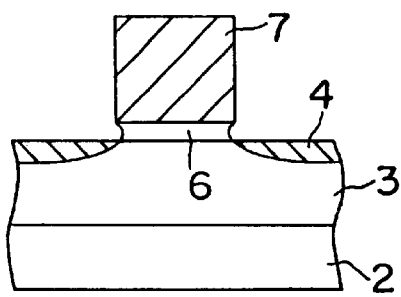

Then, the silicon nitride film is etched to form a sidewall 55 (FIG. 17E).

Figure 17F:
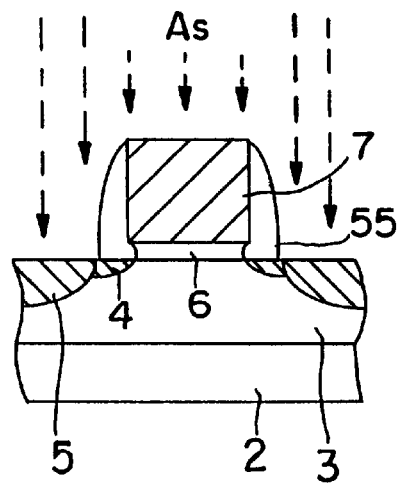

Further, a second ion implantation of Arsenic ions is carried out with an acceleration energy of 30 KeV at a dosage of $3\times10^{15}$ atoms/cm$^2$ to form source/drain region 5 in the silicon substrate 2 (FIG. 17F). The source/drain region 5 will be deeper than the extension region 4 because the source/drain region is formed by the relatively high energy ion implantation of 30 KeV.

In this step, both ends of the gate electrode 7 and the extension region 4 positioned right below the side end of the gate electrode are covered by the sidewall 55, the second ion implantation will not physically damage the gate insulating film 6. The impurity concentration of the extension region 4 adjacent to the gate electrode 6 will not be increased excessively because of the covering of the sidewall 55.

A MOSFET with extensions of source/drain region is fabricated by the aforementioned process. In the MOSFET, the gate insulating film is free from damage-induced degradation or breakdown, because the damaged layer 9 formed in the gate insulating film 6 by the first ion implantation has been removed by the wet etching.

The structure of this embodiment can suppress the generation of hot carriers because the side end portion of the gate insulating film (where hot carriers are most likely to generate) is replaced with silicon nitride that has higher dielectric constant than the gate insulating film 6.

Furthermore, the fringe electric field increases because the sidewall is made of silicon nitride that has a higher dielectric constant than the gate insulating film 6. The increased fringe electric field lowers drain electric field peak and suppresses the hot carrier generation.

(twelfth embodiment)

Figure 18A:
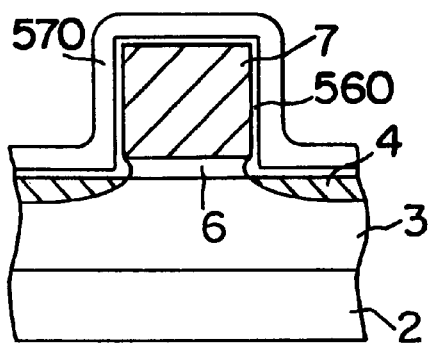
Figure 18B:
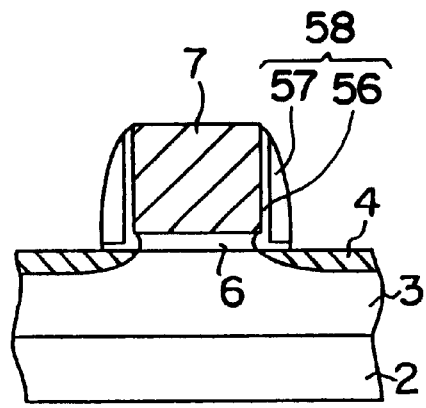
Figure 18C:
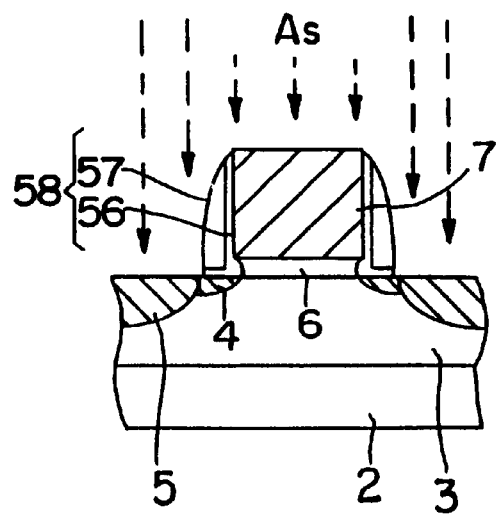

FIGS. 18A through 18C show process steps for making a semiconductor device according to another embodiment of the present invention. The MOSFET has a structure similar to that of the eleventh embodiment (FIG. 17A–17F). The new feature of this embodiment is that the sidewall 58 consists of a silicon oxide layer 57 and a silicon nitride layer 56. The basic structure of the MOSFET is same as that of the previous embodiment, and the same elements are indicated with the same numbers. Dimensions are the same unless specified otherwise.

First, p-well region 3, gate insulating film (thermally grown silicon oxide) 6, gate electrode 7, and extensions of source/drain region 4 are formed on a p-type silicon substrate 2. After that, the end portion in the gate insulating film 6 physically damaged by the ion beams is removed by wet etching. For MOSFETs with a gate insulating film of from 2 to 8 nm thick, it is preferable to remove the damaged layer up to about 5 to 20 nm deep inside from both side ends of the gate electrode. The process steps up to here are the same as the steps described in the previous embodiment referring to FIGS. 17A through 17C. After the removal of the damaged layer by wet etching, the device is water-rinsed and dried.

Then, a silicon nitride film 560 is formed by chemical vapor deposition over the silicon substrate 2 (FIG. 18A). The silicon nitride has a higher dielectric constant than the silicon oxide that forms the gate insulating film 6. The thickness of the silicon nitride film 560 is preferably from 10 to 20 nm. In this deposition step, the recess space formed after the etching of the damaged layer 9 is filled with the silicon nitride 560. The border between the silicon oxide (gate insulating film 6) and the silicon nitride 560 is at the inner position from the side ends of the gate electrode 7. Then 100 to 110 nm of silicon oxide 570 is deposited on the silicon nitride film 560 (FIG. 18A).

Next, the silicon nitride film 560 and the silicon oxide film 570 are etched to form sidewall 58 covering the sidewalls of the gate insulating film 6 and the gate electrode 7 (FIG. 18B) The sidewall fabricated in this manner has a two-layer structure and consists of the remained silicon nitride film 56 and the remained silicon oxide film 57.

Following the formation of the sidewall 58, a second ion implantation of Arsenic ions is carried out with an acceleration energy of 30 KeV at a dosage of $3\times10^{15}$ atoms/cm$^2$ to form source/drain region 5 on the silicon substrate 2 (FIG. 18C).

The structure of this embodiment can suppress the generation of hot carriers because the side end portion of the gate insulating film (where hot carriers are most likely to generate) is replaced with silicon nitride that has higher dielectric constant than the gate insulating film 6. Furthermore, the fringe electric field increases because the sidewall is made of silicon nitride that has higher dielectric constant than the gate insulating film 6. The increased fringe electric field lowers drain electric field peak and suppresses the hot carrier generation.

Another benefit of the structure is that the thickness of the silicon nitride is rather thin such as 10 to 20 nm, because the sidewall 58 is a two-layer structure consisting of the silicon nitride film 56 and the silicon oxide film 57. Since the thermal expansion rate of silicon nitride is substantially different from that of silicon, the interface between the two layers suffers considerable thermal stress. With the thin silicon nitride film of 10 to 20 nm, the thermal stress that the silicon substrate suffers during the silicon nitride deposition remains rather small, which makes the risk of damage to the silicon substrate very unlikely.

(thirteenth embodiment)

FIGS. 19A through 19E show the process steps for making a semiconductor device according to another embodiment of the present invention. The MOSFET has a structure similar to that of the twelfth embodiment (FIG. 18A–18C). The structure of the two-layer sidewall 61 is a little different from that of the sidewall 58 in the twelfth embodiment. In the twelfth embodiment, the silicon nitride film 56 is left between the silicon oxide film and the silicon substrate 2. In the sidewall 61 in this embodiment, the inner sidewall 59 (corresponding to the silicon nitride film 56 in the previous embodiment) does not exist between the outer sidewall 60 (corresponding to the silicon oxide film 57 in the previous embodiment) and the p-type silicon substrate 2 which allows the direct contact of the silicon oxide to the silicon substrate 2.

The basic structure of the MOSFET is same as that of the previous embodiment, and the same elements are indicated with the same numbers. Dimensions are the same unless specified otherwise.

First, p-well region 3, gate insulating film (thermally grown silicon oxide) 6, gate electrode 7, and extensions of source/drain region 4 are formed on a p-type silicon substrate 2. After that, the end portion in the gate insulating film 6 physically damaged by the ion beams is removed by wet etching. For MOSFETs with a gate insulating film of from 2 to 8 nm thick, it is preferable to remove the damaged layer up to about 5 to 20 nm deep inside from both side ends of the gate electrode. The process steps up to here are the same as the steps described in the previous embodiment referring to FIGS. 17A through 17C. After the removal of the damaged layer by wet etching, the device is water-rinsed and dried.

Figure 19A:
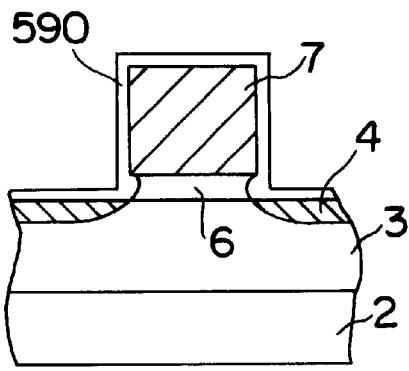

Then, a silicon nitride film 590 is formed by chemical vapor deposition over the silicon substrate 2 (FIG. 19A). The silicon nitride has a higher dielectric constant than the silicon oxide that forms the gate insulating film 6. The thickness of the silicon nitride film 590 is preferably from 10 to 20 nm. In this deposition step, the recess space formed after the etching of the damaged layer is filled with the silicon nitride 590. The border between the silicon oxide (gate insulating film 6) and the silicon nitride 590 is at the inner position from the side ends of the gate electrode 7.

Figure 19B:
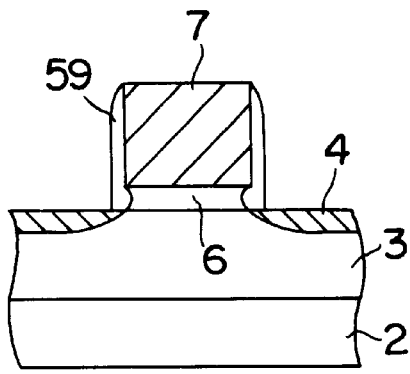

Next, the silicon nitride film 590 is etched to form inner sidewall 59 covering the sidewalls of the gate insulating film 6 and the gate electrode 7 (FIG. 19B)

Figure 19C:
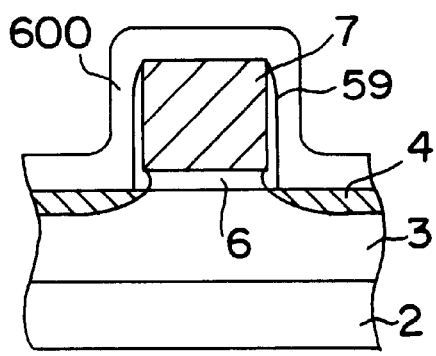

Then 100 to 110 nm of silicon oxide 600 is deposited over the silicon substrate to totally cover the inner sidewall 59 (FIG. 19C)

Figure 19D:
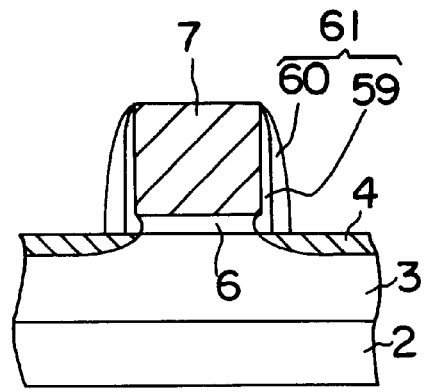

The silicon oxide is etched to form outer sidewall 60 as shown in FIG. 19D.

The inner sidewall 59 and the outer sidewall 60 make the sidewall 61.

Figure 19E:
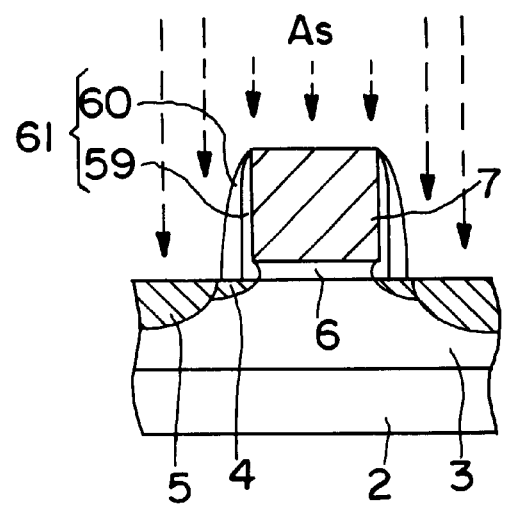
Figure 20A:
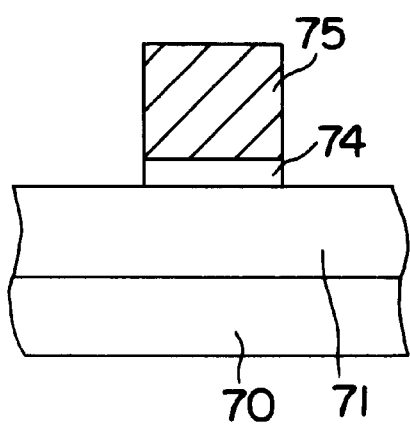
FIGS. 20A through 20D illustrate an exemplary embodiment of the prior art.
Figure 20C:
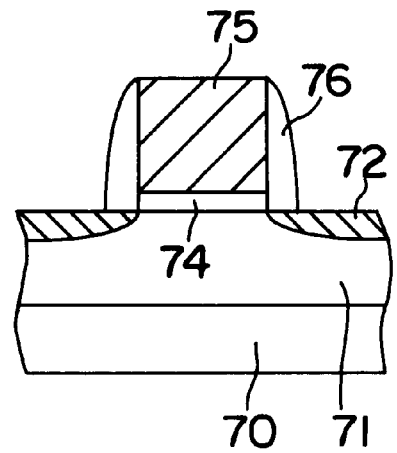
Figure 20B:
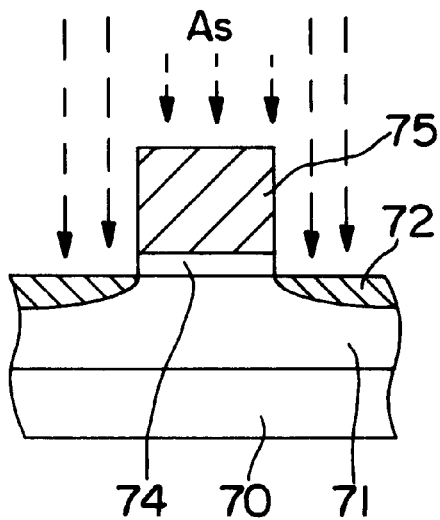
Figure 20D:
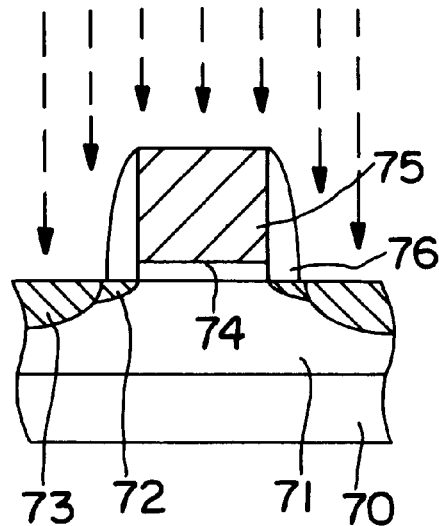

Following the formation of the sidewall 61, a second ion implantation of Arsenic ions is carried out with an acceleration energy of 30 KeV at a dosage of $3\times10^{15}$ atoms/cm$^2$ to form source/drain region 5 on the silicon substrate 2 (FIG. 19E).

The structure of this embodiment can suppress the generation of hot carriers because the side end portion of the gate insulating film (where hot carriers are most likely to generate) is replaced with silicon nitride that has higher dielectric constant than the gate insulating film 6. Furthermore, the fringe electric field increases because the sidewall is made of silicon nitride that has a higher dielectric constant than the gate insulating film 6. The increased fringe electric field lowers drain electric field peak and suppresses the hot carrier generation.

Another benefit of the structure is that the thickness of the silicon nitride is rather thin, such as 10 to 20 nm, because the sidewall 61 is a two-layer structure consisting of the silicon nitride film 59 and the silicon oxide film 60. Since the thermal expansion rate of silicon nitride is substantially different from that of silicon, the interface between the two layers suffers considerable thermal stress. With the thin silicon nitride film of 10 to 20 nm, the thermal stress that the silicon substrate suffers during the silicon nitride deposition remains rather small, which makes the risk of damage to the silicon substrate very unlikely.

Furthermore, this MOSFET structure is suitable for manufacturing semiconductor devices of CMOS structure. For making a CMOS structure, both N-type impurity ions (such as As) and P-type impurity ions (such as B) should be diffused to form activated regions on the same silicon substrate. P-type impurity ions like boron are easier to diffuse than N-type impurity ions, and a short-channel effect will be more likely to take place between the p-type activated regions sandwiching a gate therebetween.

Therefore, first, N-channel activated regions are formed in a silicon substrate with gate electrodes thereon by diffusing N-type impurity ions using a mask layer having openings formed corresponding to predetermined N-type region sites. Next, the inner sidewall 59 of silicon nitride is formed and a mask layer having openings formed corresponding to predetermined P-type region sites is formed thereon. Then, P-type impurity ions are diffused into the silicon substrate. In this step, the P-type impurity ions laterally proceed toward the gate electrode. The inner sidewall 59 automatically defines the P-type region somewhat apart from the gate. Thus, the lateral diffusion of the P-type impurity ions does not reach under the gate electrode, and it becomes less likely that a short-channel effect takes place between the p-type activated regions sandwiching the gate electrode therebetween. The thickness of the silicon nitride film 590 to form the innner sidewall 59 should be decided considering the lateral diffusion length of the p-type impurity ions.

In the eleventh, twelfth, and thirteenth embodiment, silicon nitride was used as a material with a dielectric constant higher than that of silicon oxide. Among other material that can be used are $Ta_2O_5$, $SrTiO_3$(=STO), $(Ba_xSr_{1-x})TiO_3$(=BST), $PbZrO_3$–$PbTiO_3$(=PZT), $SrBi_2Ta_2O_9$(=Y1), $TiO_3$, $ZrO_2$, $Y_2O_3$, $BaTiO_3$, $Sr_xBa_{1-x}Nb_2O_6$ etc.

In the 5th to 10th embodiments, the present invention was explained with the cases in which the capacitor insulating films 32, 43, 53 are physically damaged by the ion implantation for providing the conductivity to the polycrystalline silicon patterns 330, 440, and 540 to form the upper capacitor electrodes 33, 44, and 54, respectively. Physical damage can also be caused in steps for the fabrication of other devices on a semiconductor substrate along with the MOS capacitor. Specifically, physical damage in the capacitor insulating films 32, 43, and 53 is caused by the effect of doping steps such as ion implantation for fabricating other semiconductor devices. In such cases, by removing the physically damaged portion or portion to be physically damaged, the same results will be achieved as in the 5th to 10th embodiments.

Another kind of damage that the gate insulating film or capacitor insulating film can suffer is charging damage. This damage takes place when the electric charge built up in the gate electrode or capacitor electrode by ion implantation runs through the insulating films to the silicon substrate or lower electrode.

This kind of charging damage can be effectively prevented by removing the damaged layer damaged by ion implantation as in the 1st, 3rd, 5th, 7th, 9th, 11th, 12th, and 13th embodiments. The electric charge accumulated in the gate electrode 7, 24 or capacitor electrode 33, 44, 54 flows to p-type silicon substrate 2, 20, 30, 40, 50, respectively. It is a little later after the ion implantation when the charge begins to flow, and the damaged layer where the conductivity becomes relatively higher due to the ion bombardment has already been formed in the gate insulating film 6, 23 or capacitor insulating film 32, 43. The electric charge flows selectively through the damaged layer and substantially not through the non-damaged portion of the films. The portion where the electric charge does not flow suffers no charging damage. The portion damaged by the electric charge current is removed in the following wet etching step. Thus charging damage will not be left in the gate insulating film 6, 23 or capacitor insulating film 32, 43.

In the aforementioned embodiments, the present invention is implemented in a method for making a semiconductor device which includes an ion implantation step as an impurity doping method. Among other doping technologies that can be applied in the present invention are plasma implanting technologies such as plasma-based ion implantation, plasma immersion ion implantation, and plasma doping In addition, an N-type semiconductor substrate, such as N-type silicon substrate, can be used in the present invention as well as P-type silicon substrate.

While the invention has been described in detail and with reference to specific embodiments thereof, it will be apparent to one skilled in the art that various changes and modifications can be made therein without departing from the spirit and the scope thereof.

What is claimed is:

1. A semiconductor device comprising:

a semiconductor substrate;

a first insulating layer on said semiconductor substrate;

a gate electrode formed on said first insulating layer, wherein the bottom surface of said gate electrode is positioned at a uniform distance from the substrate surface; and spatially isolated source and drain regions formed in said semiconductor substrate, wherein said gate electrode projects beyond a corresponding side of said first insulating layer.

2. A semiconductor device according to claim 1, further comprising:

source and drain regions;

wherein at least one side end of said first insulating layer is positioned offset toward an inside of a side surface facing said source and drain regions.

3. A semiconductor device according to claim 1, further comprising a side insulating layer formed covering a side surface of said gate electrode and the side end of said first insulating layer.

4. A semiconductor device according to claim 1, wherein the entire bottom surface of said gate electrode is positioned at said uniform distance from the substrate surface.

5. A semiconductor device comprising:

a semiconductor substrate;

a first insulating layer on said semiconductor substrate;

a second insulating layer formed covering a side surface of said gate electrode and the side end of said first insulating layer, wherein said second insulating layer has a higher dielectric constant than a dielectric constant of said first insulating layer;

a gate electrode formed on said first insulating layer, wherein the bottom surface of said gate electrode is positioned at a uniform distance from the substrate surface; and spatially isolated source and drain regions formed in said semiconductor substrate, wherein said gate electrode projects beyond a corresponding side of said first insulating layer.

6. A semiconductor device as claimed in claim 5, further comprising a third insulating layer formed on said second insulating layer.

7. A semiconductor device as claimed in claim 5, further comprising:

a third insulating layer formed on said second insulating layer.

8. A semiconductor device as claimed in claim 7, wherein a dielectric constant of said third insulating layer is substantially the same as the dielectric of said second insulating layer.

9. A semiconductor device according to claim 5, wherein the entire bottom surface of said gate electrode is positioned at said uniform distance from the substrate surface.

10. A semiconductor device according to claim 6, wherein the entire bottom surface of said gate electrode is positioned at said uniform distance from the substrate surface.

11. A semiconductor device according to claim 2, wherein the entire bottom surface of said gate electrode is positioned at said uniform distance from the substrate surface.

12. A semiconductor device according to claim 3, wherein the entire bottom surface of said gate electrode is positioned at said uniform distance from the substrate surface.

* * * * *